(12) United States Patent
Kang et al.

(10) Patent No.: US 11,251,301 B2
(45) Date of Patent: Feb. 15, 2022

(54) CROSS-BAR VERTICAL TRANSPORT FIELD EFFECT TRANSISTORS WITHOUT CORNER ROUNDING

(71) Applicant: International Business Machines Corporation, Armonk, NY (US)

(72) Inventors: Tsung-Sheng Kang, Ballston Lake, NY (US); Ruilong Xie, Niskayuna, NY (US); Tao Li, Beijing (CN); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/817,724

(22) Filed: Mar. 13, 2020

(65) Prior Publication Data
US 2021/0288181 A1 Sep. 16, 2021

(51) Int. Cl.
*H01L 29/78* (2006.01)
*H01L 21/762* (2006.01)
*H01L 29/66* (2006.01)
*H01L 29/06* (2006.01)

(52) U.S. Cl.
CPC .... *H01L 29/7827* (2013.01); *H01L 21/76224* (2013.01); *H01L 29/0657* (2013.01); *H01L 29/66666* (2013.01)

(58) Field of Classification Search
CPC .......... H01L 29/7827; H01L 29/66666; H01L 21/76224; H01L 29/065
USPC ....................................... 257/329
See application file for complete search history.

(56) References Cited

U.S. PATENT DOCUMENTS

| | | | |
|---|---|---|---|
| 6,448,606 B1* | 9/2002 | Yu | H01L 27/115 257/315 |
| 9,252,021 B2 | 2/2016 | Ng et al. | |
| 9,627,476 B2 | 4/2017 | Diaz et al. | |
| 9,627,535 B2 | 4/2017 | Xie et al. | |
| 9,853,127 B1* | 12/2017 | Anderson | H01L 21/823425 |
| 10,103,246 B2 | 10/2018 | Cheng et al. | |
| 10,224,417 B2 | 3/2019 | Basker et al. | |
| 10,340,364 B2 | 7/2019 | Zhang et al. | |
| 10,418,484 B1 | 9/2019 | Xie et al. | |
| 2010/0090270 A1* | 4/2010 | Hsieh | H01L 29/7811 257/328 |

(Continued)

*Primary Examiner* — Mohammad M Hoque
(74) *Attorney, Agent, or Firm* — Fleit Intellectual Property Law; Ian Gibbons

(57) ABSTRACT

A semiconductor device structure for a vertical field effect transistor comprises a substrate with a shallow trench isolation (STI) region. A lower source/drain area is formed on the STI region with a first semiconductor fin, a second semiconductor fin, and a third semiconductor fin. The third semiconductor fin is formed to couple the first semiconductor fin to the second semiconductor fin across the lower source/drain area. The STI region that is beneath the lower source/drain area comprises opposing sidewall portions curved in opposing directions. In one example the lower source/drain area is formed only at an intersection between the STI region and one or more of the first semiconductor fin, the second semiconductor fin, and the third semiconductor fin. In other example, the second semiconductor fin is disposed parallel to the first semiconductor fin and together with the third semiconductor fin resulting in an H-shaped structure from a top-down view.

13 Claims, 13 Drawing Sheets

(56) References Cited

U.S. PATENT DOCUMENTS

| | | | | |
|---|---|---|---|---|
| 2014/0332932 A1* | 11/2014 | Zhang | .............. | H01L 21/76224 |
| | | | | 257/622 |
| 2015/0357432 A1* | 12/2015 | Lin | ...................... | H01L 27/092 |
| | | | | 257/24 |
| 2019/0198669 A1 | 6/2019 | Park et al. | | |
| 2019/0214482 A1* | 7/2019 | Xie | ................... | H01L 21/02532 |
| 2019/0287863 A1* | 9/2019 | Xie | ................... | H01L 21/02211 |
| 2021/0111271 A1* | 4/2021 | Kim | ................... | H01L 29/0657 |

\* cited by examiner

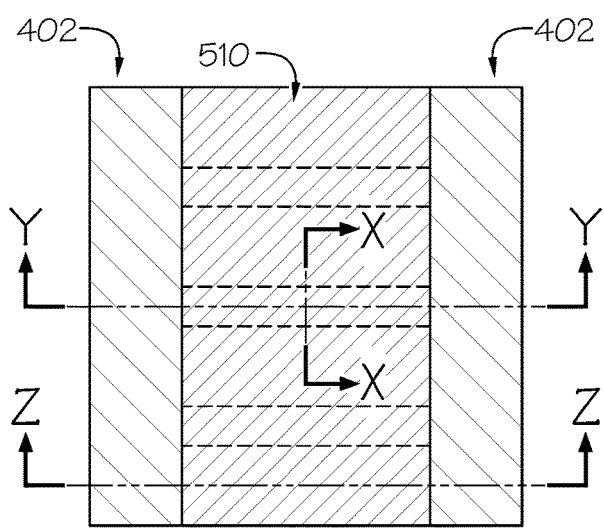
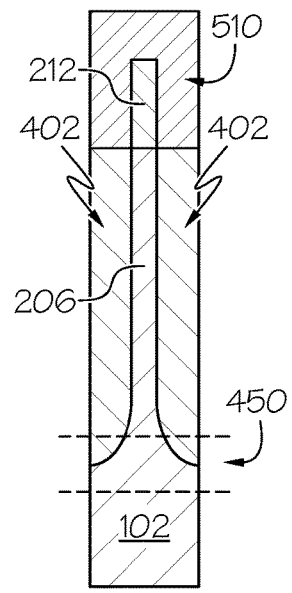
FIG. 6A
FIG. 6B
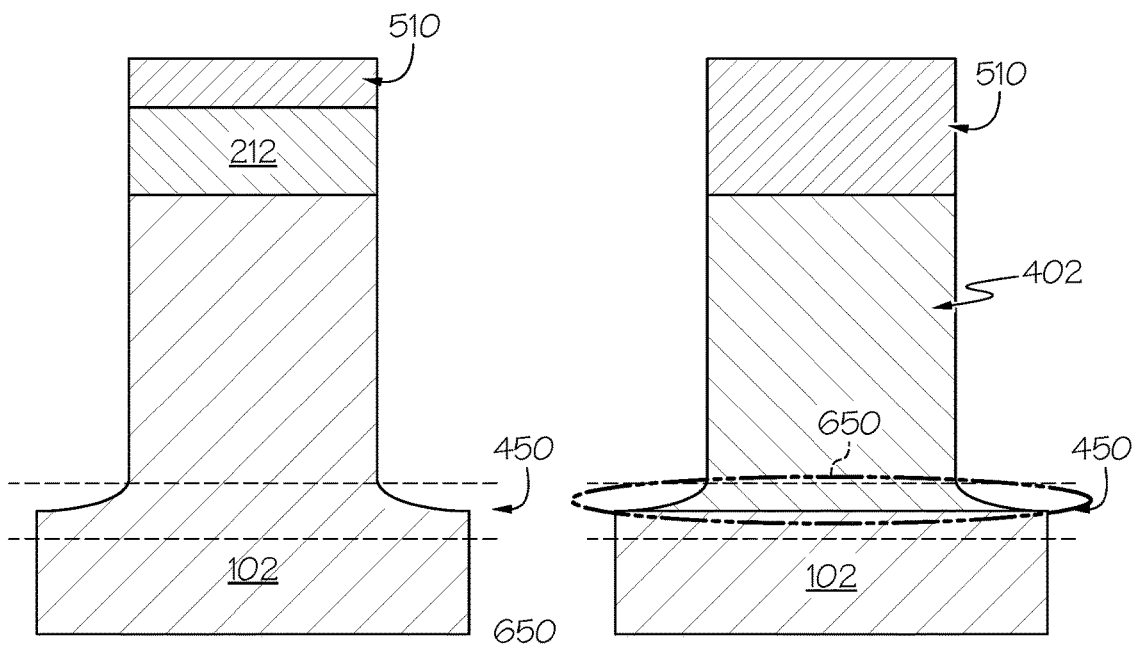
FIG. 6C
FIG. 6D1
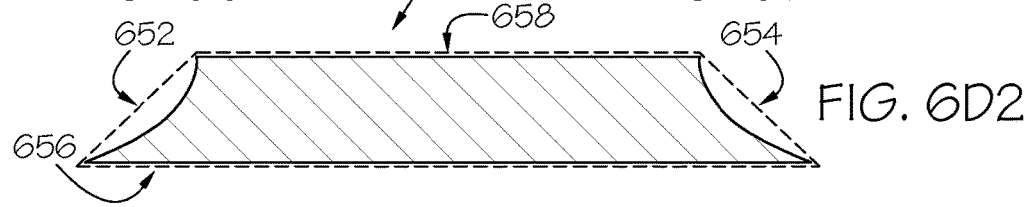
FIG. 6D2

CROSS-BAR VERTICAL TRANSPORT FIELD EFFECT TRANSISTORS WITHOUT CORNER ROUNDING

BACKGROUND OF THE INVENTION

The present invention generally relates to the field of semiconductors, and more particularly relates to vertical field effect transistors.

Vertical transport field effect transistors (VTFETs or VFETs) are becoming viable device options for semiconductor devices, for example, complementary metal oxide semiconductor (CMOS) devices, beyond 5 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method of forming a semiconductor device structure comprises forming a first semiconductor fin on a substrate of a vertical transport field effect transistor with a first hard mask layer formed thereon A sacrificial epitaxial layer is formed around the first semiconductor fin. A second hard mask layer over the first hard mask layer and the sacrificial epitaxial layer is formed. Next both the sacrificial epitaxial layer and the first semiconductor fin are cut leaving a remaining portion of the sacrificial epitaxial layer. A second semiconductor fin and a third semiconductor fin are formed using the remaining portion of the sacrificial epitaxial layer as a mandrel.

The sacrificial epitaxial layer is removed. Next a lower epitaxial layer for a source/drain area is formed on the STI region. In one example the sacrificial epitaxial layer is formed only at an intersection between the STI region and one or more of the first semiconductor fin, the second semiconductor fin, and the third semiconductor fin.

In another example, the first semiconductor fin is formed in a first direction and the second semiconductor fin and the third semiconductor fin are formed in a second direction.

In still another example, the second semiconductor fin and the third semiconductor fin are parallel and the second direction is perpendicular to the first direction resulting in an essentially a H-shaped structure from a top-down view.

In another embodiment, a semiconductor device structure for a vertical field effect transistor comprises a substrate with a shallow trench isolation (STI) region. A lower source/drain area is formed on the STI region with a first semiconductor fin, a second semiconductor fin, and a third semiconductor fin. The third semiconductor fin is formed to couple the first semiconductor fin to the second semiconductor fin across the lower source/drain area. The STI region that is beneath the lower source/drain area comprises opposing sidewall portions curved in opposing directions. Typically the first semiconductor fin and the second semiconductor fin are formed above and immediately adjacent to the lower source/drain area. In one example, the first semiconductor fin and the second semiconductor fin are oriented in a first direction across the lower source/drain area. The third semiconductor fin is disposed in a second direction across the lower source/drain area. The third semiconductor fin is formed above and immediately adjacent to the lower source/drain area and wherein the third semiconductor fin extends laterally between and is in direct contact with adjacent ends of the first semiconductor fin and the second semiconductor fin.

In another example the lower source/drain area is formed only at an intersection between the STI region and one or more of the first semiconductor fin, the second semiconductor fin, and the third semiconductor fin. In other example, the second semiconductor fin is disposed parallel to the first semiconductor fin and together with the third semiconductor fin resulting in an essentially a H-shaped structure from a top-down view.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 6A is a top view of a semiconductor device structure, FIG. 6B is a corresponding cross-sectional view taken along line X-X, FIG. 6C is a corresponding cross sectional view taken along Y-Y, and FIG. 6D1 is a corresponding cross section view take along Z-Z, and FIG. 6D2 is a detailed view of the buried layer 650 of FIG. 6D1, after an etching process to form a recess on the structure in FIGS. 5A, 5B, 5C and 5D, according to one embodiment of the present invention;

DETAILED DESCRIPTION

Non-Limiting Review of Semiconductor Device Descriptions

Figure 1A:
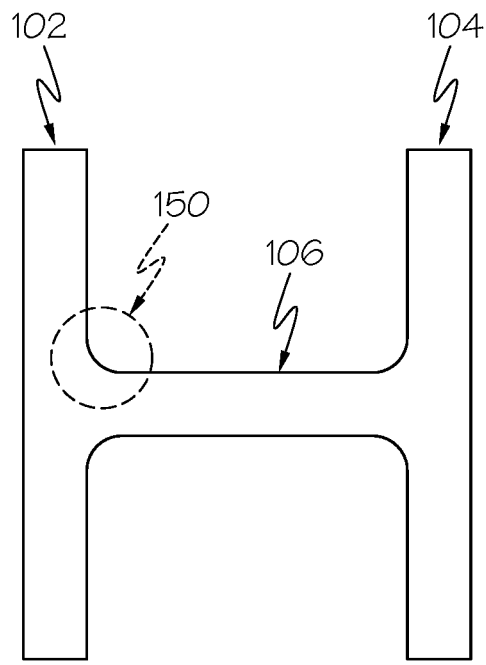
FIG. 1A is a top view and FIG. 1B is a corresponding side elevational view of a cross-bar vertical tunnel field effect transistor VTFET semiconductor device structure, according to the prior art.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Vertical channel semiconductor devices such as vertical transport FETs (VTFETs) are being pursued as a viable CMOS architecture beyond the 7 nm node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

Vertical Transport FET without Corner Rounding Problem

Figure 1B:
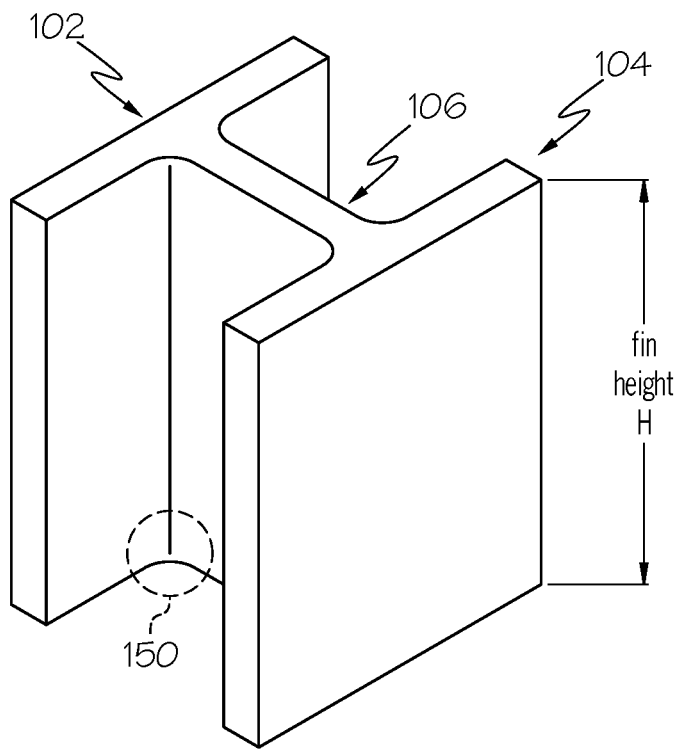

FIG. 1A is a top view and FIG. 1B is corresponding side elevational view of a cross-bar vertical tunnel field effect transistor VTFET semiconductor device structure according the prior art. More specifically, shown is an H-shaped fin structure is shown in FIG. 1A, two fins 102 and 104 connected by a third fin 106 to form an H-shaped configuration. The fins 104 are interconnected by a cross fin 106 that is oriented orthogonal to the fins 104 and interconnects the fins 104 at their center such that when viewed from the top down, the fins 104/cross fin 106 has an essentially H-shape or crossbar shape.

Referring to FIG. 1, the formation of an H fin tends to have the rounded corner 150 between the sections of the fin that go in different orientation i.e., between 102 and 106 and/or between 104 and 106. This rounding is due to the differences in micro-loading and the arriving angle of the radicals during directionally etching e.g., reactive ion etching (RIE) process. Rounded corners result in a dimension of the fin that is not uniform across all the fin sections within each transistor. This issue can compromise the performance of device. For example, it is difficult to control current with a threshold voltage for a transistor that has dimension of the fin which are not uniform.

Vertical Transport FET without Corner Rounding

Figure 2A:
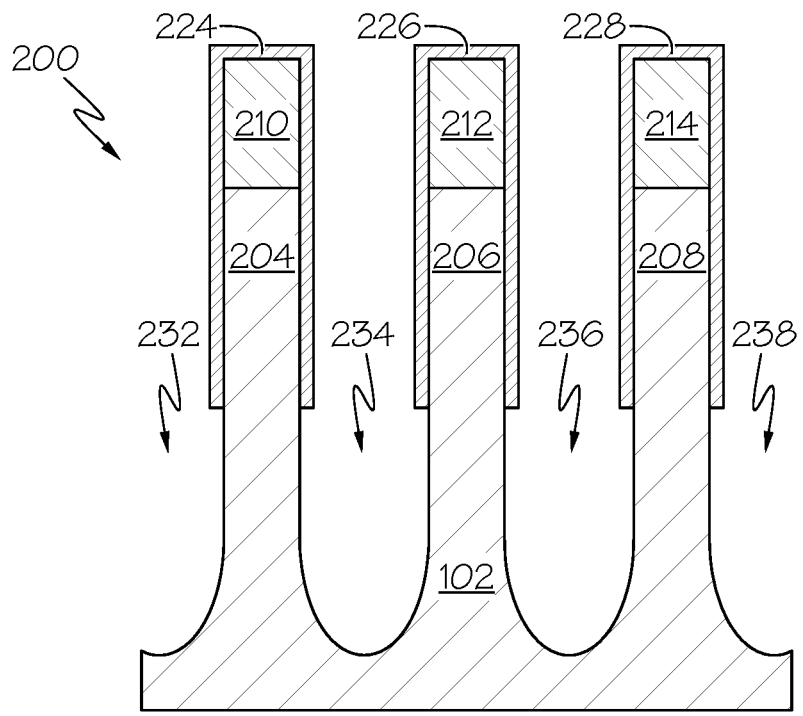
FIG. 2A is a cross-sectional view of a semiconductor device structure taken along line X-X of the corresponding top view FIG. 2B after a plurality of fins have been formed on a substrate with liner material deposited, according to one embodiment of the present invention.

FIGS. 2A-B to FIGS. 12A-D illustrate one or more processes for creating the H-shaped fin without any rounded corner between the fins in different orientations. In general, the figures comprise various cross-sectional views of a structure. More specifically, FIG. 2A and FIG. 3A show a cross sectional side view taken along line X-X of the corresponding top view. FIGS. 4B-D to FIGS. 12B-D show three cross sectional views taken along X-X, Y-Y and Z-Z of the corresponding top view in FIGS. 4A to 12A.

Figure 2B:
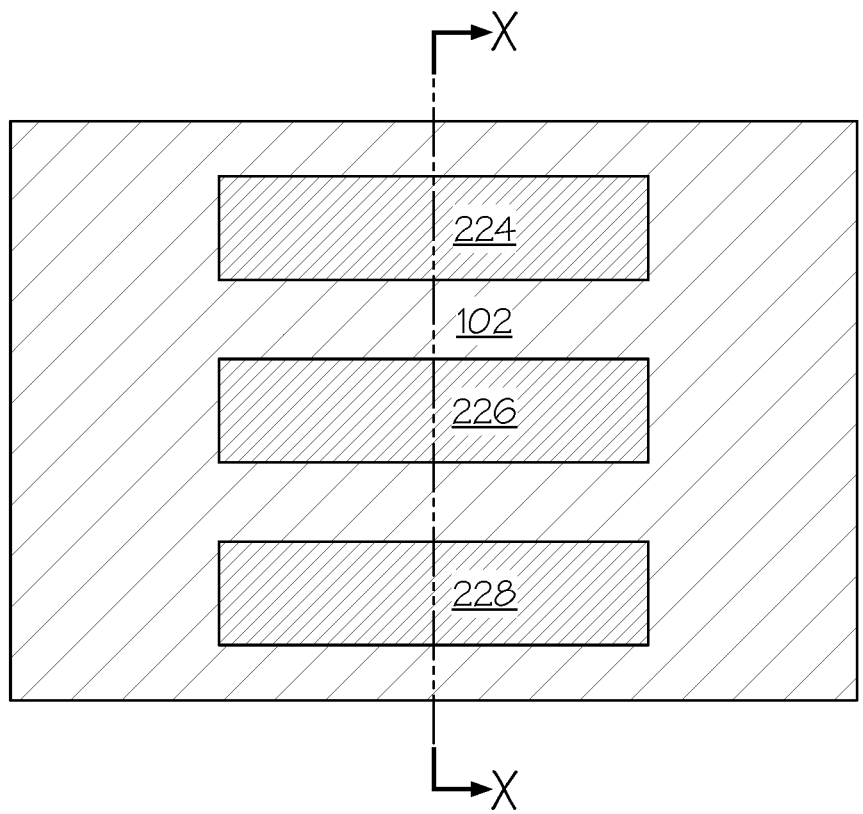
Figure 3A:
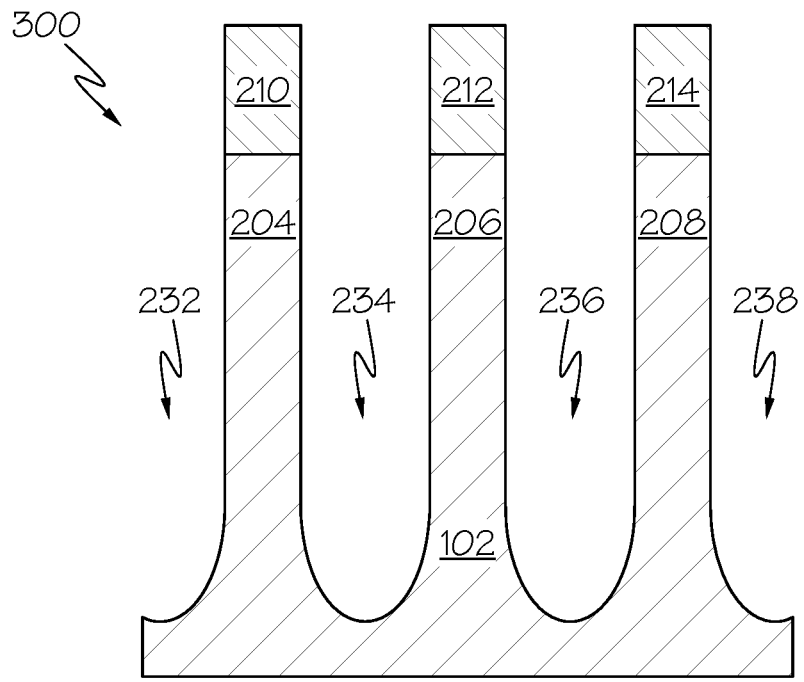
FIG. 3A is a cross-sectional view of a semiconductor device structure taken along line X-X of the corresponding top view FIG. 3B after the liner material has been removed from the structure in FIGS. 2A and 2B, according to one embodiment of the present invention.

Turning now to FIG. 2A shown is a cross-sectional view of a semiconductor device structure taken along line X-X of the corresponding top view FIG. 2B after a plurality of fins have been formed on a substrate with liner material deposited. More specifically, FIG. 2A and FIG. 2B illustrate a semiconductor device structure 200 at a given point in the fabrication process. For example, FIG. 2A illustrates a substrate 102; a plurality of fin structures 204, 206, 208; and a hard mask HM1 210, 212 214 formed on and in contact with a top surface of each semiconductor fin structure 204, 206, 208. In some embodiments, the substrate 102 is a bulk substrate. The structure 200 may comprise semiconductor fins (channels) 204, 206, 208 for PFET devices, NFET devices, or a combination of both. In one embodiment, the substrate 102 comprises entirely of a semiconductor material. The substrate 102 may comprise a single crystalline semiconductor material or a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 102 may comprise undoped single crystalline silicon or single crystalline silicon doped with p-type dopant atoms or n-type dopant atoms. Examples of materials for the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multigate devices can be formed. In other embodiments, the substrate 102 may be formed on and in contact with a handle substrate or an insulating layer disposed in contact with a handle substrate. In this embodiment, the handle substrate includes similar materials to those discussed above.

Doping of the substrate 102 (or other semiconductor layer from which the fin structures 204, 206, 208 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device, at concentrations in the general range of, for example, $e20/cm^3$.

In other embodiments, the substrate 102 may be a silicon-on-insulator (SOI) substrate. In this example, an optional dielectric layer (e.g., a BOX layer or oxide layer) overlies the substrate, and the fins 204, 206, 208 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the semiconductor fins 204, 206, 208 are fabricated may be formed utilizing various methods such as a layer transfer process including a bonding step, or an implantation process such as SIMOX (Separation by IMplantation of OXygen). This semiconductor material/layer may be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from $1 \times 10 \text{ A}18$ atoms/cm3 to $2 \times 10 \text{ A}21$ atoms/cm3. N-type transistors are produced by doping the semiconductor material/layer with elements from group V of the periodic table (e.g., phosphorus, antimony, or arsenic).

The semiconductor fins 204, 206, 208 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fin structures 204, 206, 208 may be subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). A bottom source/drain recess areas 232, 234, 236, and 238 is also shown, which may be formed using etching such as directional RIE. After the RIE etching process, the photo-resist mask used in the lithographic etching process may be removed, leaving the fin structures 204, 206, 208 and dielectric hard masks 224, 226, 228. Planarization, for example, CMP can be performed to remove excess material.

An additional dielectric (shown as part of dielectric 224, 226, 228) may then be formed over the entire structure. Note the hard mask 224, 226, 228 may be formed in more than one layer, such as such as a liner dielectric stack. The dielectric layer, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

Figure 3B:
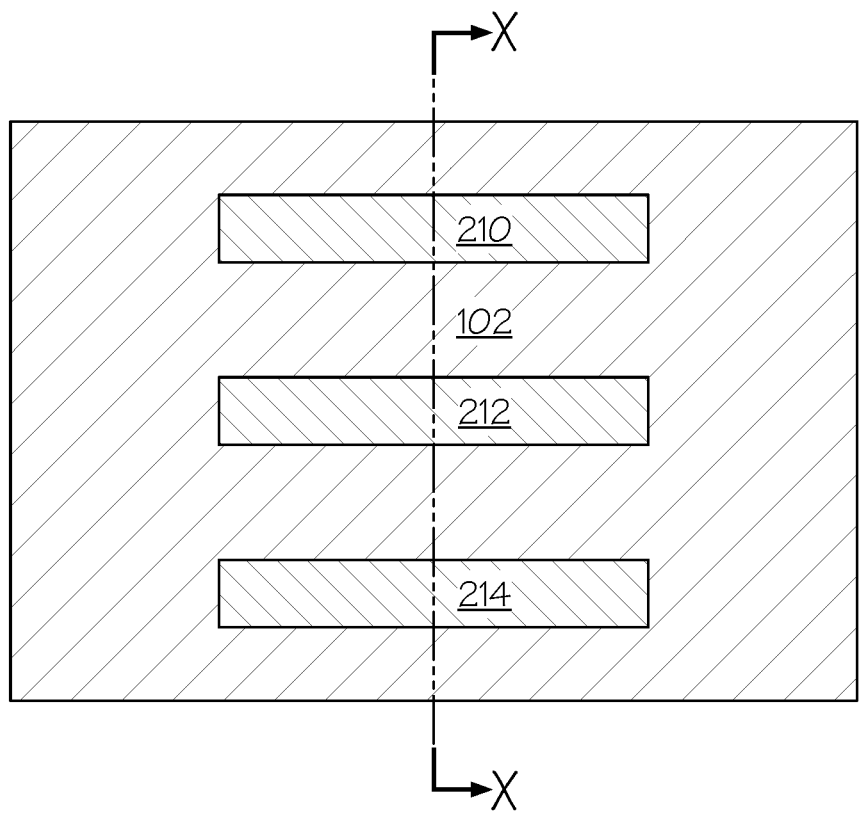

Turning now to FIG. 3A is a cross-sectional view of a semiconductor device structure taken along line X-X of the corresponding top view FIG. 3B after the liner or hard masks 224, 226, 228 has been removed from the structure in FIGS. 2A and 2B. Removing the hard masks 224, 226, 228 is performed, in one embodiment, by an etching process. The etch may be a wet etch, dry etch, or a combination of wet and dry etching processes that may be isotropic such that the bottom source/drain recess areas bottom recess areas 232, 234, 236, and 238 are slightly enlarged. For example, a chemical vapor etching (CVE) with an HCl/H2 gas mixture may be utilized to perform the etch.

Figure 4A:
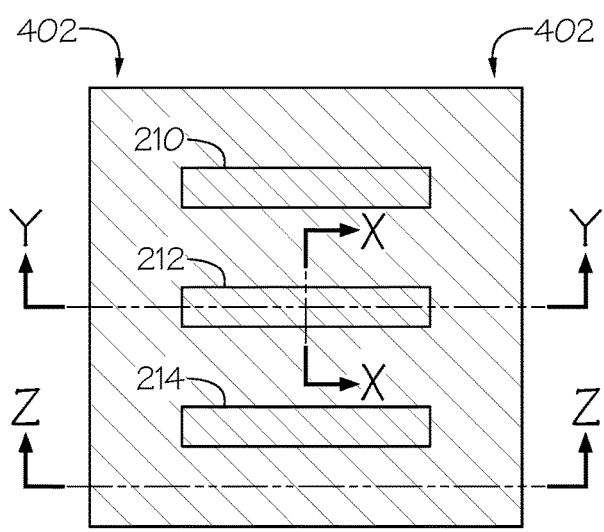
FIG. 4A is a top view of a semiconductor device structure.
Figure 4B:
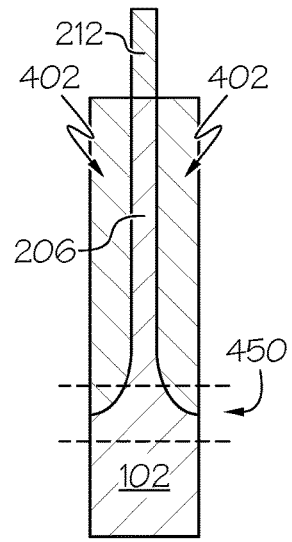
FIG. 4B is a corresponding cross-sectional view taken along line X-X.
Figure 4C:
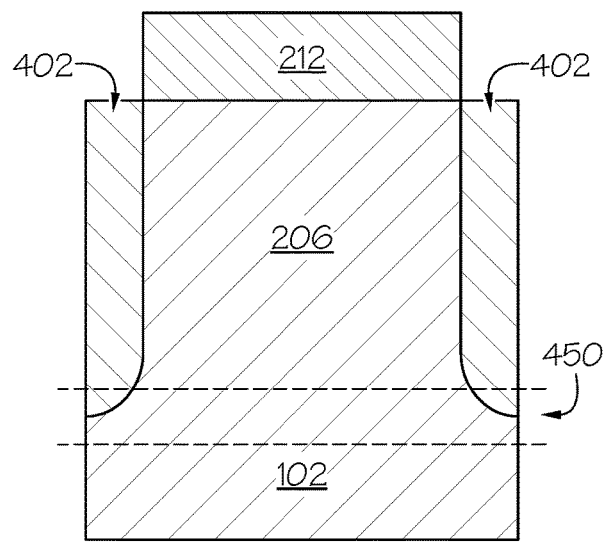
FIG. 4C is a corresponding cross sectional view taken along Y-Y.
Figure 4D:
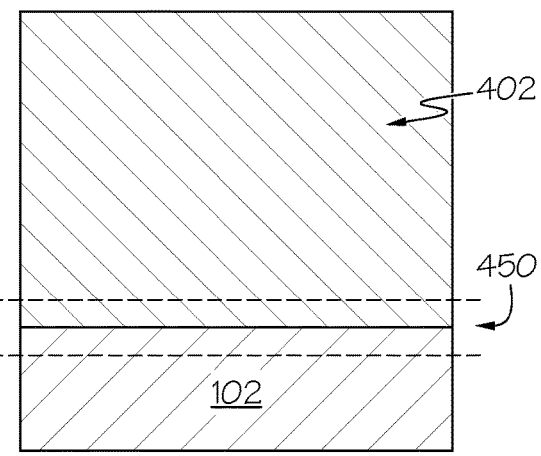
FIG. 4D is a corresponding cross section view take along Z-Z, after a first epitaxial layer has been grown on the structure in FIGS. 3A and 3B, according to one embodiment of the present invention.

Next, FIG. 4A is a top view of a semiconductor device structure, FIG. 4B is a corresponding cross-sectional view taken along line X-X, FIG. 4C is a corresponding cross sectional view taken along Y-Y and FIG. 4D is a corresponding cross section view take along Z-Z, after a first epitaxial layer 402 has been grown on the structure in FIGS. 3A and 3B, according to one embodiment of the present invention. The first epitaxial layer 402 may be formed by growing a doped epitaxial material e.g., epitaxial silicon (Si), epitaxial germanium (Ge) and/or epitaxial silicon germanium (SiGe) such as SiGe30. The region 450 is where the corners in a vertical transport FET corner rounding occurs. The presently claimed invention eliminates or minimizes the corner rounding effect.

Figure 5A:
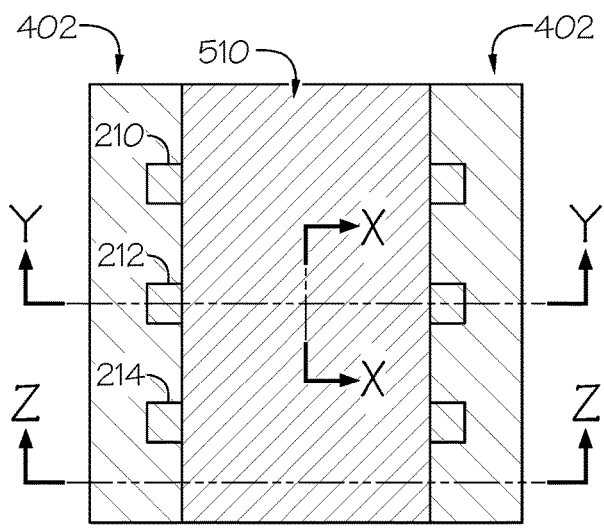
FIG. 5A is a top view of a semiconductor device structure.
Figure 5B:
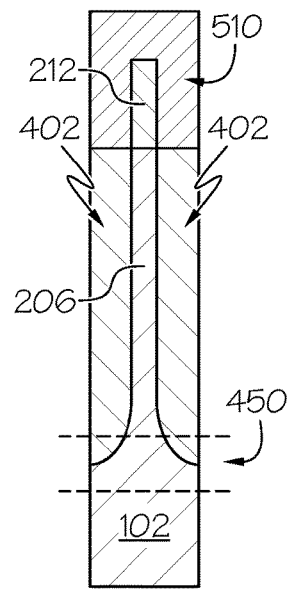
FIG. 5B is a corresponding cross-sectional view taken along line X-X.
Figure 5C:
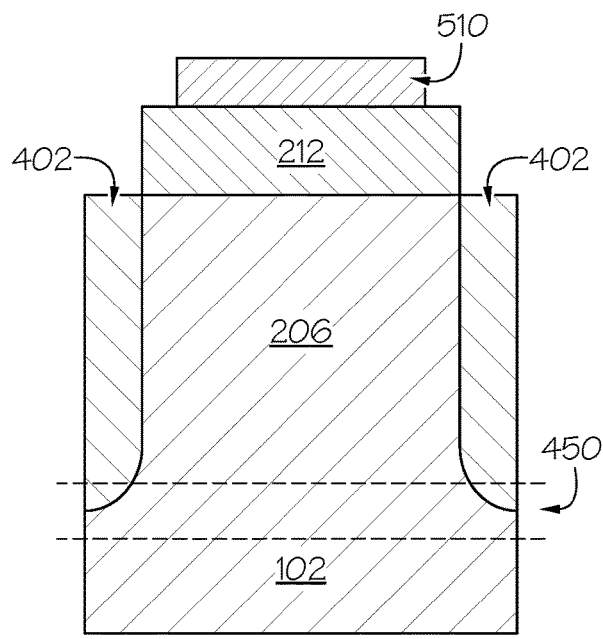
FIG. 5C is a corresponding cross sectional view taken along Y-Y.
Figure 5D:
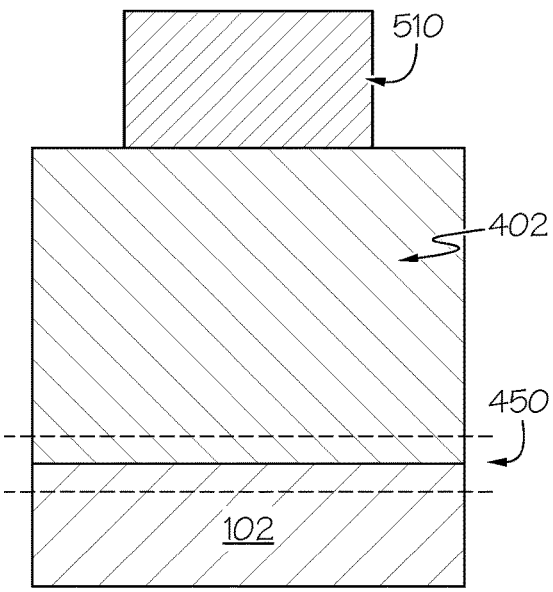
FIG. 5D is a corresponding cross section view take along Z-Z, after patterning to cover the horizontal region of the fin with another dielectric hard mask layer 510 formed on the structure in FIGS. 4A, 4B and 4C, according to one embodiment of the present invention.

Next in FIG. 5A is a top view of a semiconductor device structure, FIG. 5B is a corresponding cross-sectional view taken along line X-X, FIG. 5C is a corresponding cross sectional view taken along Y-Y and FIG. 5D is a corresponding cross section view take along Z-Z, after patterning to cover the horizontal region of the fin with another dielectric hard mask layer 510 formed on the structure in FIGS. 4A, 4B and 4C, according to one embodiment of the present invention. The additional dielectric hard mask layer 510 is formed using patterning with blanket growth that forms a dielectric to cover the horizontal regions of the H-fin structure of FIGS. 4A, 4B and 4C. Planarization, for example, CMP can be performed to remove excess material.

The additional dielectric hard mask layer 510 may then be formed as shown after the patterning process utilizing lithography and etch process. Note that the additional dielectric hard mask layer 510 may be formed in more than one layer, such as such as a NON liner dielectric stack. The additional dielectric hard mask layer 510, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

Referring to FIG. 6A is a top view of a semiconductor device structure, FIG. 6B is a corresponding cross-sectional view taken along line X-X, FIG. 6C is a corresponding cross sectional view taken along Y-Y, FIG. 6D1 is a corresponding cross section view take along Z-Z, and FIG. 6D2 is a detailed view of the buried layer 650 of FIG. 6D1, after an etching process to form a recess on the structure in FIGS. 5A, 5B, 5C and 5D, according to one embodiment of the present invention. The first epitaxial layer 402 that is exposed i.e. not below hard mask 510 may be etched using a directional etching process, such as RIE. The etching process results in a trapezoidal-like shape 650 with two parallel sides 656 and 658 and two non-parallel sides 652, 654. The two non-parallel sides 652, 654 are defined by curves which curve away from each other at a lower region as shown. The second and third fin will be formed as shown in FIGS. 7A, 7B, 7C and 7D using the sides 652, 654 of area 650, followed by the process to bury the rounded corner by the STI layer, which only allows the perpendicular corner to be above the top of STI layer.

Figure 7A:
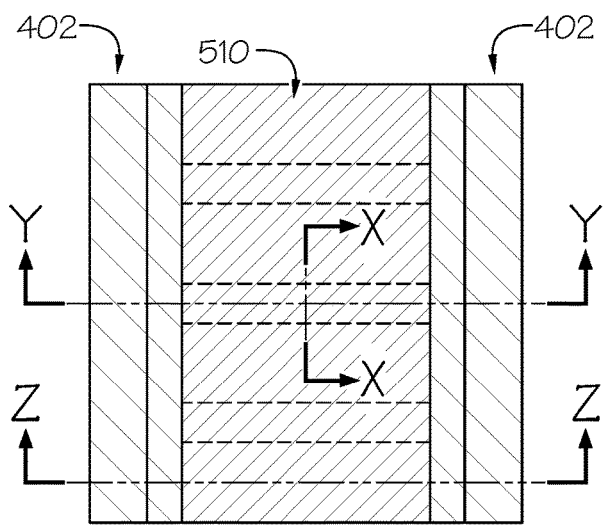
FIG. 7A is a top view of a semiconductor device structure.
Figure 7B:
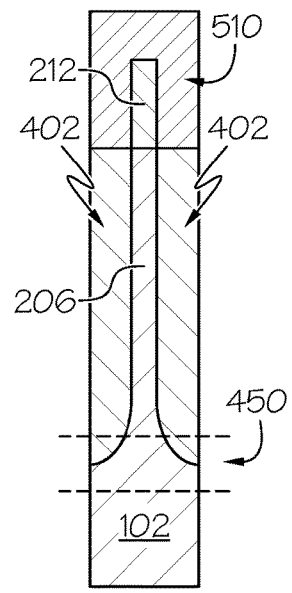
FIG. 7B is a corresponding cross-sectional view taken along line X-X.
Figure 7C:
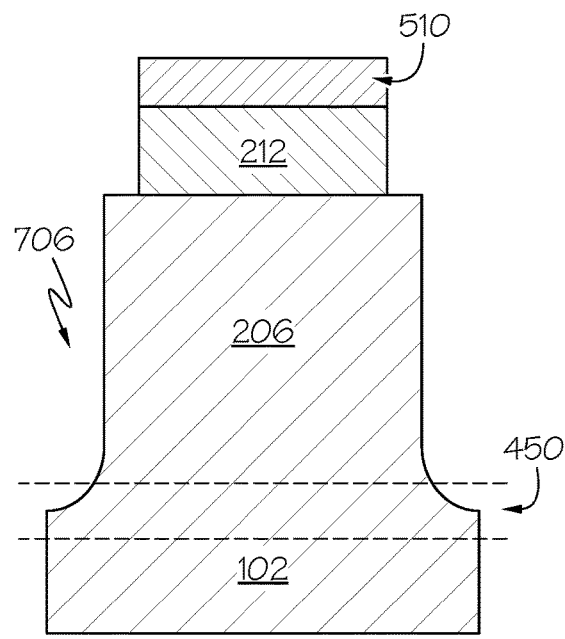
FIG. 7C is a corresponding cross sectional view taken along Y-Y.
Figure 7D:
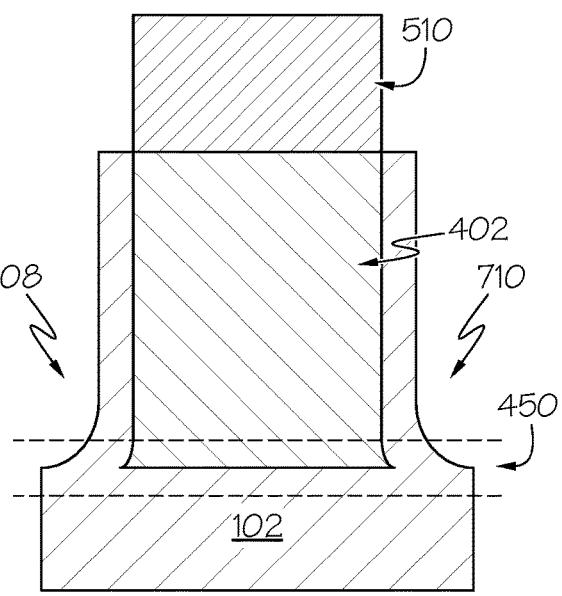
FIG. 7D is a corresponding cross section view take along Z-Z, after a conformal layer over the structure in FIGS. 6A, 6B, 6C and 6D, according to one embodiment of the present invention.

Next in FIG. 7A, shown is a top view of a semiconductor device structure, FIG. 7B is a corresponding cross-sectional view taken along line X-X, FIG. 7C is a corresponding cross sectional view taken along Y-Y and FIG. 7D is a corresponding cross section view take along Z-Z, after a conformal layer 706 is grown over the structure in FIGS. 6A, 6B, 6C and 6D, according to one embodiment of the present invention. The conformal layer 706 can be, but is not limited to a doped epitaxial material (e.g., epitaxial silicon (Si), epitaxial germanium (Ge) and/or epitaxial silicon germanium (SiGe)) on the substrate 102 at the base of the fins 234 and forming fin structures 708 and 710 on the first epitaxial layer 402.

Figure 8A:
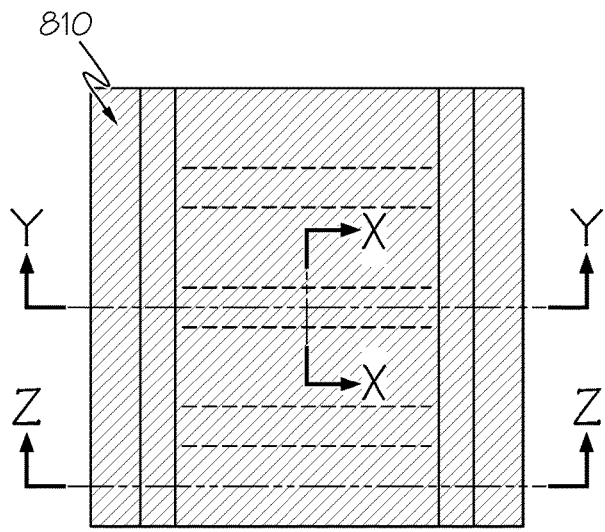
FIG. 8A is a top view of a semiconductor device structure.
Figure 8B:
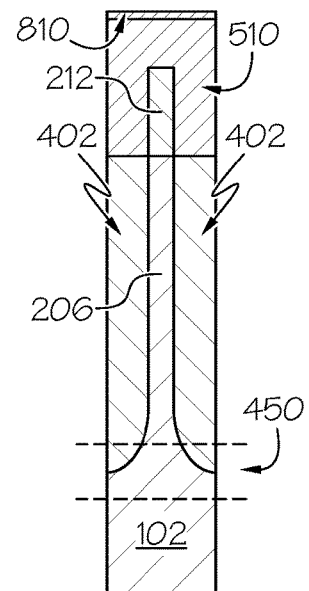
FIG. 8B is a corresponding cross-sectional view taken along line X-X.
Figure 8C:
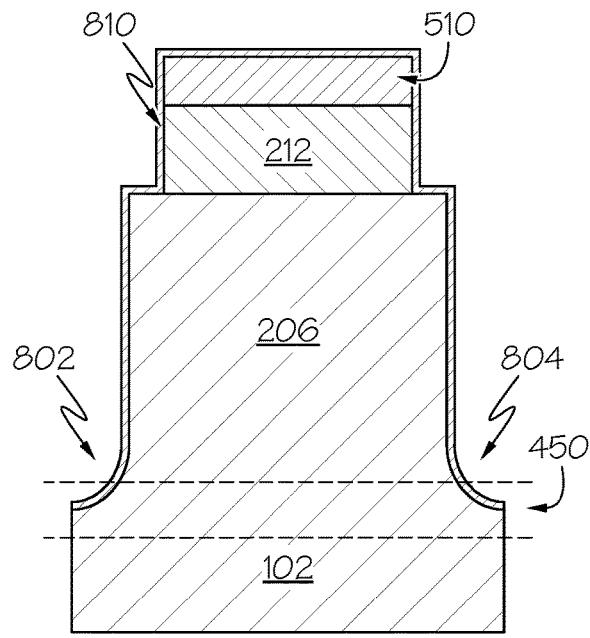
FIG. 8C is a corresponding cross sectional view taken along Y-Y.
Figure 8D:
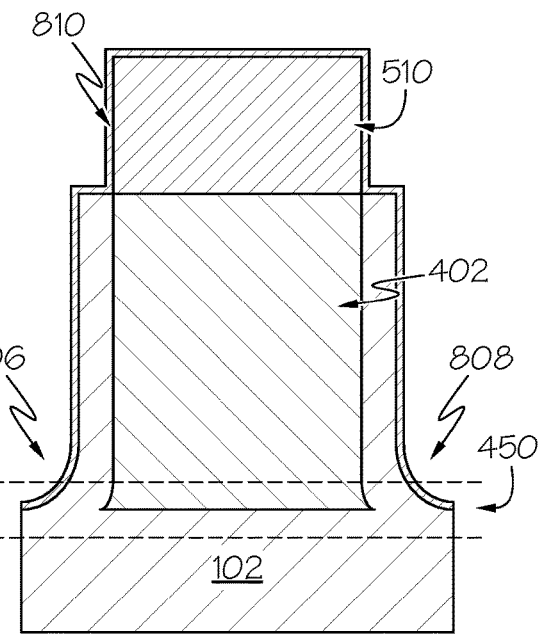
FIG. 8D is a corresponding cross section view take along Z-Z, after a deposition liner layer over the structure in FIGS. 7A, 7B, 7C and 7D according to one embodiment of the present invention.

Turning to FIG. 8A is a top view of a semiconductor device structure, FIG. 8B is a corresponding cross-sectional view taken along line X-X, FIG. 8C is a corresponding cross sectional view taken along Y-Y and FIG. 8D, after a deposition liner layer 810 over the structure in FIGS. 7A, 7B, 7C and 7D, according to one embodiment of the present invention. In one embodiment, a deposition process such as ALD is performed to conformally deposit the liner layer 810 in contact with the bottom recess area 802, 804, 806, 808; the first hard mask layer 212; the additional hard mask layer 510; and sidewalls of the exposed fin portions 206. The liner material 810 may comprise silicon oxycarbonitride (SiOCN), silicon boron carbonitride (SiBCN), and/or the like.

Figure 9A:
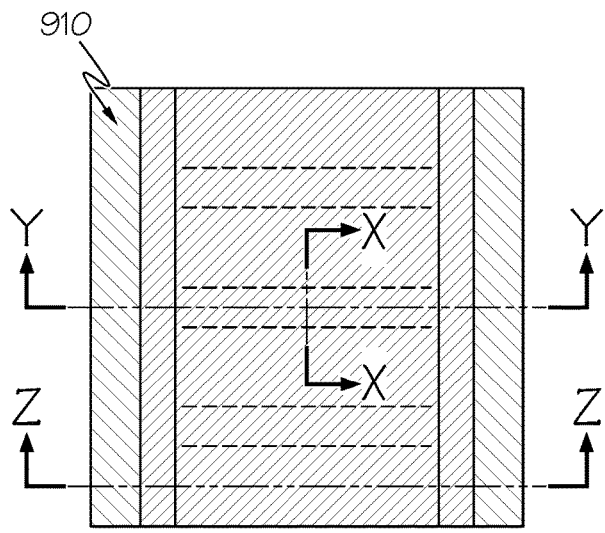
FIG. 9A is a top view of a semiconductor device structure.
Figure 9B:
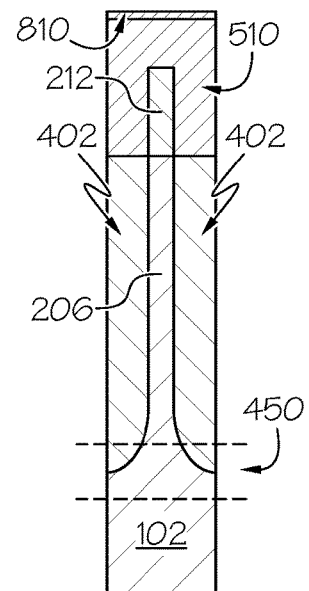
FIG. 9B is a corresponding cross-sectional view taken along line X-X.
Figure 9C:
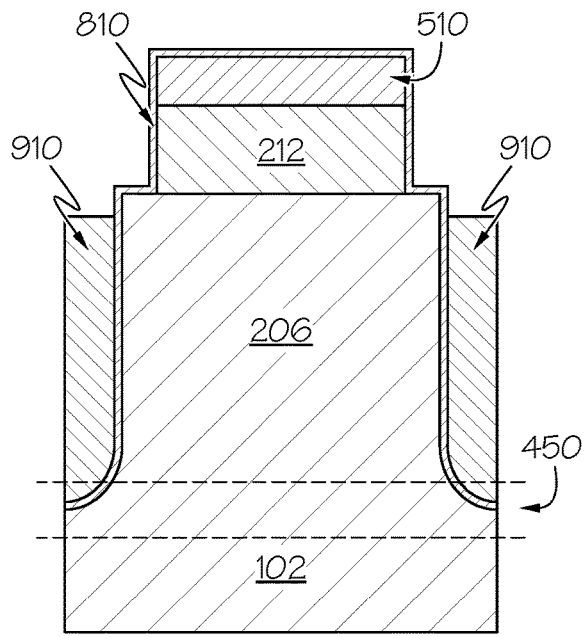
FIG. 9C is a corresponding cross sectional view taken along Y-Y.
Figure 9D:
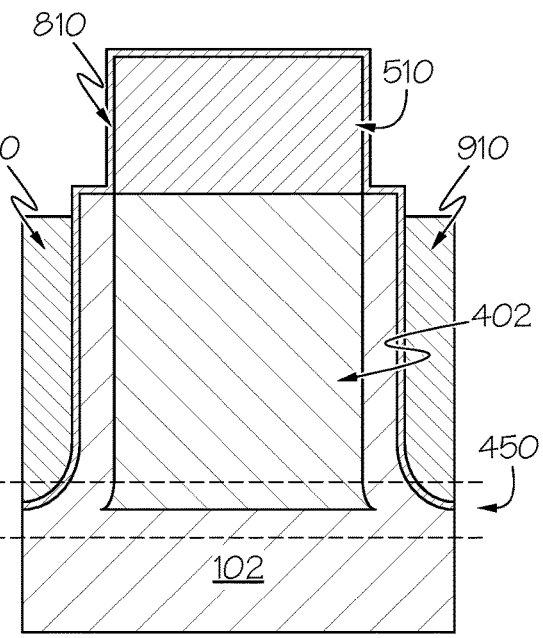
FIG. 9D is a corresponding cross section view take along Z-Z, after an organic planarization layer (OPL), followed by planarization and etching the structure in FIGS. 8A, 8B, 8C and 8D, according to one embodiment of the present invention.

Next in FIG. 9A is a top view of a semiconductor device structure, FIG. 9B is a corresponding cross-sectional view taken along line X-X, FIG. 9C is a corresponding cross sectional view taken along Y-Y and FIG. 9D is a corresponding cross section view take along Z-Z, after an organic planarization layer (OPL) 910, followed by planarization and etching the structure in FIGS. 8A, 8B, 8C and 8D, according to one embodiment of the present invention. OPL open/ash in work function metal patterning is typically performed using a dry removal process (e.g., reactive ion etch or ash).

The dry-etch/ash is used here to recess the OPL layer until it is below the height of the semiconductor fins.

Figure 10A:
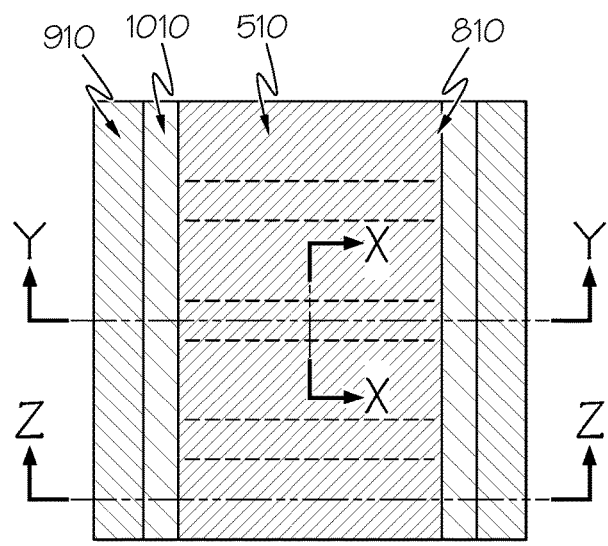
FIG. 10A is a top view of a semiconductor device structure.
Figure 10B:
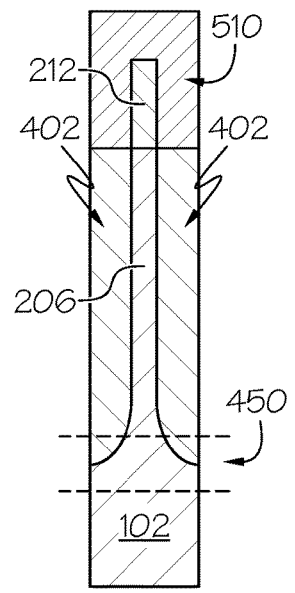
FIG. 10B is a corresponding cross-sectional view taken along line X-X.
Figure 10C:
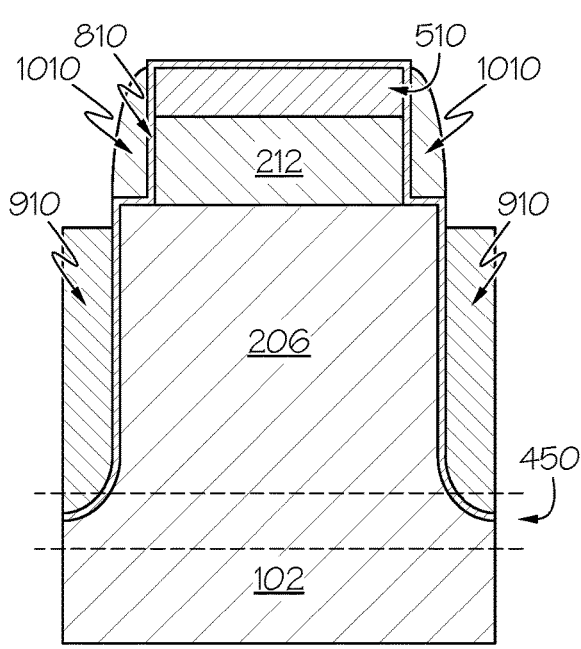
FIG. 10C is a corresponding cross sectional view taken along Y-Y.
Figure 10D:
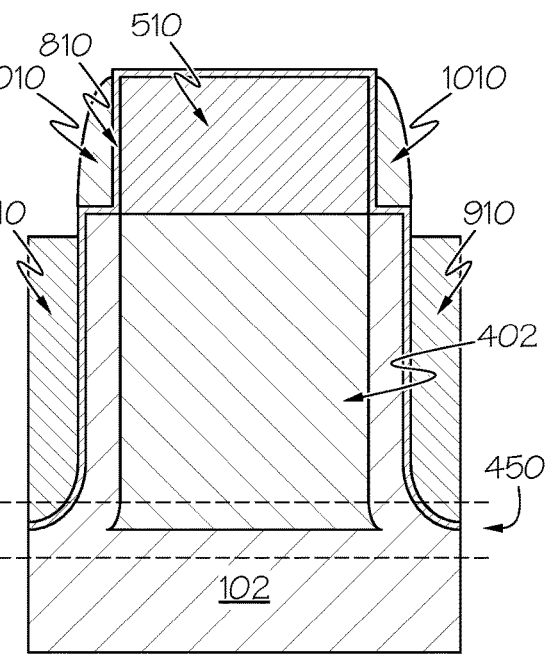
FIG. 10D is a corresponding cross section view take along Z-Z, after formation of a spacer a new fin formation over structure in FIGS. 9A, 9B, 9C and 9D according to one embodiment of the present invention.

Next in FIG. 10A is a top view of a semiconductor device structure, FIG. 10B is a corresponding cross-sectional view taken along line X-X, FIG. 10C is a corresponding cross sectional view taken along Y-Y and FIG. 10D is a corresponding cross section view take along Z-Z, after formation of a spacer 1010 to act as a hard mask for a new fin formation over structure in FIGS. 9A, 9B, 9C and 9D, according to one embodiment of the present invention. The spacer 1010 may be formed on and in contact with the top surface of the gate conductor layers 206. The top surface of the spacer 1010 may be co-planar with the top surfaces of the fin structures 104 to 108. In one embodiment, the top spacer 1010 may comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure. The OPL layer can then be removed using wet process such as SPM, which utilizes the sulfuric acid/hydrogen peroxide mixture e.g. $H_2SO_4+H_2O_2$.

Figure 11A:
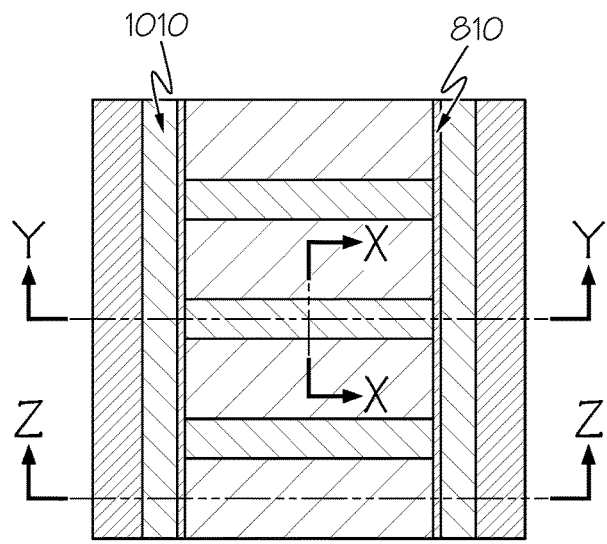
FIG. 11A is a top view of a semiconductor device structure.
Figure 11B:
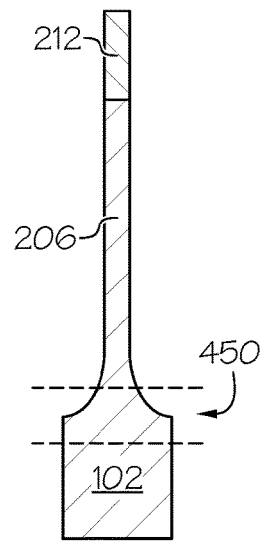
FIG. 11B is a corresponding cross-sectional view taken along line X-X.
Figure 11C:
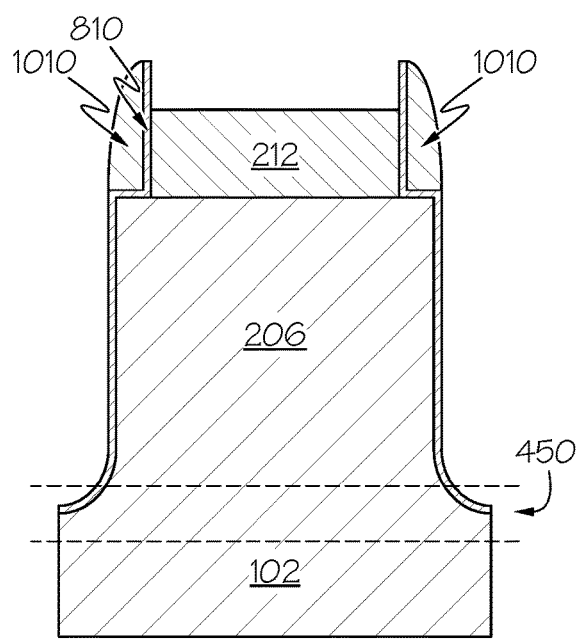
FIG. 11C is a corresponding cross sectional view taken along Y-Y.
Figure 11D:
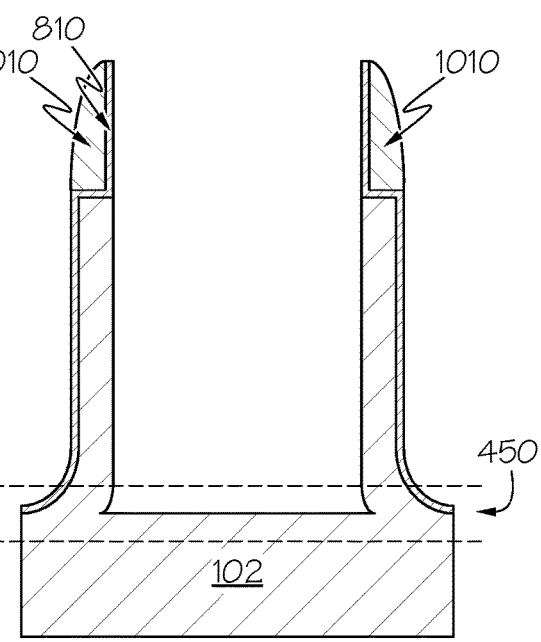
FIG. 11D is a corresponding cross section view take along Z-Z, after removal of the organic planarization layer and the additional dielectric hard mask layer and a second epitaxial layer formation on the structure in FIGS. 10A, 10B, 10C and 10D, according to one embodiment of the present invention.

FIG. 11A is a top view of a semiconductor device structure, FIG. 11B is a corresponding cross-sectional view taken along line X-X, FIG. 11C is a corresponding cross sectional view taken along Y-Y and FIG. 11D is a corresponding cross section view take along Z-Z, after removal of the organic planarization layer 910 and the additional dielectric hard mask layer 510 and a second epitaxial layer formation on the structure in FIGS. 10A, 10B, 10C and 10D, according to one embodiment of the present invention.

The additional dielectric hard mask layer 510 may then be selectively removed by, for example, RIE which stops on the fin structures 204 to 208.

A final epitaxial layer (not shown) may be formed by growing a doped epitaxial material e.g., epitaxial silicon (Si), epitaxial germanium (Ge) and/or epitaxial silicon germanium (SiGe) such as SiGe30.

Figure 12A:
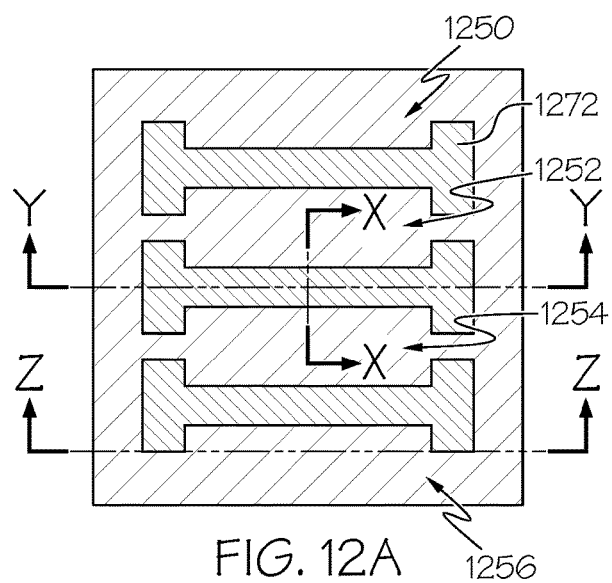
FIG. 12A is a top view of a semiconductor device structure.
Figure 12B:
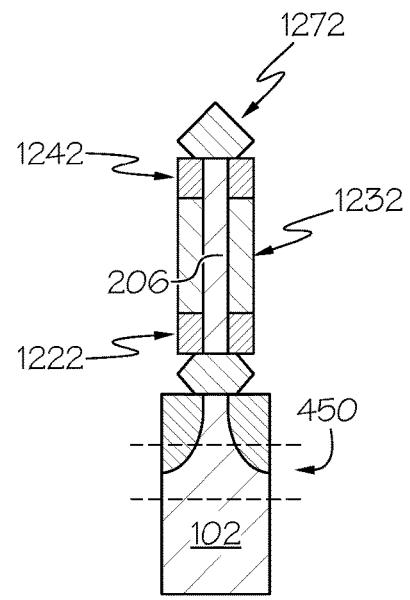
FIG. 12B is a corresponding cross-sectional view taken along line X-X.
Figure 12C:
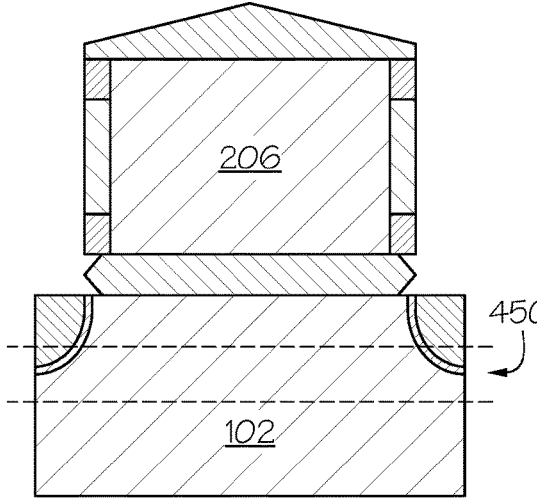
FIG. 12C is a corresponding cross sectional view taken along Y-Y.
Figure 12D:
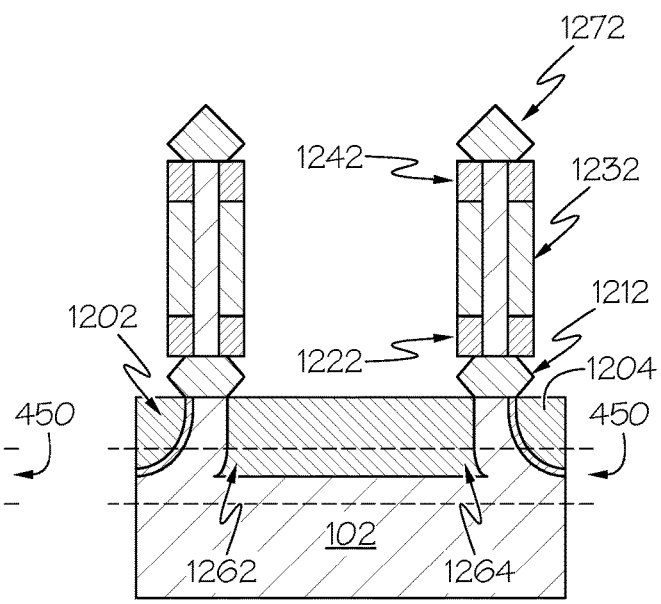
FIG. 12D is a corresponding cross section view take along Z-Z, after additional fabrication techniques are performed on the structure in FIGS. 11A, 11B, 11C and 11D for a vertical tunnel field effect transistor, according to one embodiment of the present invention.

Next, FIG. 12A is a top view of a semiconductor device structure, FIG. 12B is a corresponding cross-sectional view taken along line X-X, FIG. 12C is a corresponding cross sectional view taken along Y-Y and FIG. 12D is a corresponding cross section view take along Z-Z, after further processing of the structure in FIG. 11 after additional fabrication techniques are performed for a vertical tunnel field effect transistor, according to one embodiment of the present invention. FIGS. 12A, 12B, 12C and 12D shows one example of a VTFET structure after additional fabrication processes have been performed.

FIGS. 12A to 12D further show that one or more device isolation regions 1202 such as shallow trench isolation (STI) regions 1202 are formed to insulate/isolate different devices from each other. The isolation regions 1202 to 1204 may be formed by depositing an organic planarization layer (OPL) and patterning the OPL.

The structure 1200, in one embodiment, comprises a lower epi-layer for a lower source/drain area 1212, a lower spacer 1222, a gate structure 1232, a top spacer 1242, and top epi-layer for a top source/drain area 1272. It should be noted that embodiments of the present invention are not limited to the example of a VTFET structure shown in FIG. 12 as one or more additional features/layers may be added; one or more features/layers may be removed; and/or one or more features/layers may have a different shape and/or configuration than what is shown.

In one embodiment, the bottom spacer 1222 is formed on and in contact with the bottom source/drain layer formed in epitaxy layer 1212. Example materials for the bottom source/drain layer 1212 include (but are not limited to) phosphorus doped silicon epitaxy for an nFET device and boron doped silicon germanium epitaxy for a pFET device.

It is important to note that conventional VTFET structures have a lower source/drain area formed on the substrate. In contrast, notice in the presently claimed invention that the lower epitaxial layer for the lower source/drain area 1212 is formed on the STI region 1202 rather than formed on the substrate 102 itself.

Further, it is important that the gate stack portion 1242 of each of the first semiconductor fin 204 (not shown), the second semiconductor fin 206, and the third semiconductor fin 208 (not shown) from bottom epitaxial layer 1212 to the top epitaxial layer 1272 is a straight fin. Unlike other conventional VTFET structures, the non-straight part of each fin (204, 206, 208) is buried in the STI region 1202. More specifically, the portion 450 of the fin 206 is formed below STI region 1202, the corner of the interface between fins at different orientations is rounded as shown in FIG. 12B thru FIG. 12D. This rounding is especially noticeable at the bottom of the fin 206 in region 450. Notice this burying in the STI region 1202 of the rounded portion of the fin results in a rectangular corner for the area above the STI region 1202, i.e. at the lower epitaxial layer 1212. The thickness of STI region 1202 defines the distance between bottom epitaxial layer 1212 to the substrate 102.

It is important to note that in one example that no epitaxial area/lower source drain area 1212 is formed in regions 1252 thru 1256. Rather an epitaxial area 1212 is formed only at an intersection between the STI region 1202 and one or more of the semiconductor fins 204, 206, 208.

Notice that the STI region 1202 that is beneath the lower source/drain area 1212 comprises opposing sidewall portions 1262, 1264, curved in opposing directions.

The gate structures 1232, in one embodiment, each comprise a gate dielectric layer (not shown) and a gate conductor layer (not shown). The gate dielectric layer contacts contact the sidewalls of the fin structures 204 to 208 and the bottom spacer 1222. The gate dielectric layer may be formed by depositing a thin conformal layer over the structure by, for example, CVD, PECVD, or ALD. In one embodiment, the gate dielectric layer may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer may further include dopants such as lanthanum or aluminum. After formation of the gate dielectric layer, an annealing process may be performed to form bottom source/drain junctions within a portion of the fin structures 204 to 208.

The gate conductor layers may be formed in contact with and surrounding the vertical sidewalls of the gate conductor layers. In one embodiment, the gate conductor layers may be formed by depositing one or more conductive materials over the structure. Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof.

The top spacer 1242 may be formed on and in contact with the top surface of the gate conductor layers; the top surface of the gate conductor layers. The top surface of the spacer may be co-planar with the top surfaces of the fin structures 204 to 208. In one embodiment, the top spacer 1242 may comprise the same or different material as the bottom spacer layer 1222. For example, the top spacer 1242 may comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure.

Top source/drains 1272 may then be formed in contact with at least the top source/drain junctions. The top source/drains 1272 may be formed using an epitaxy process. For example, selective epitaxy may be used to grow material from the exposed top source/drain junctions to form the top source/drain layers 1272. The top source/drain layers 1272 may either be a source layer or a drain layer and may comprise in-situ doping (boron, in one embodiment for PFET and phosphorus, in one embodiment, for NFET). It should be noted that, according to one embodiment, the top source/drain layers 1272 may not contain any doping. Doping may be performed using any standard approach such as ion implantation. As shown in FIG. 12, the bottom source/drain layers 1212 and/or the top source/drain layers 1272 comprise angled sides. In some embodiments, the top/source drain layers 112 comprise a diamond shape. It should be noted that, non-faceted epitaxy and/or multiple epitaxy steps can be used to form the bottom source/drain layers 1212 and/or the top source/drain layers 1272 without limiting the scope of the present disclosure. It should also be noted that, in some embodiments, the bottom source/drain layers 1212 and/or the top source/drain layers 1272 may be merged.

In one or more embodiments, an annealing process may be conducted after the formation of the top source/drain layer 1272 in order to push the top junctions further into the fin structures 204 to 208. A thermal anneal process such as laser anneal, flash anneal, rapid thermal anneal (RTA), furnace anneal, or any suitable combination of those annealing techniques can be performed. In some embodiments, the junctions may have a height of, for example, 4 nm to 10 nm. Although other dimensions are applicable as well.

An additional dielectric (not shown) may then be formed over the entire structure. The dielectric layer, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The dielectric layer may be patterned and etched to form one or more contact openings/trenches (not shown) to expose the bottom source/drain layers 1212 and/or the top source/drain layers 1272. One or more contact metal/metallic layers (not shown) may then be formed within the contact opening(s). The contact metal/metallic layers may fill the contact opening(s) and contact the bottom source/drain layers 1212 and/or the top source/drain layers 1272 (or any liner and/or the silicide formed thereon). The contact metal layer(s), in one embodiment, may comprise tungsten (W), titanium (Ti), tantalum (Ta), TiN, hafnium (Hf), zirconium (Zr), niobium (Nb), or alloys comprising carbon. However, other materials are applicable as well.

Flow Diagram of Reducing Corner Rounding of VTFET

Figure 13:
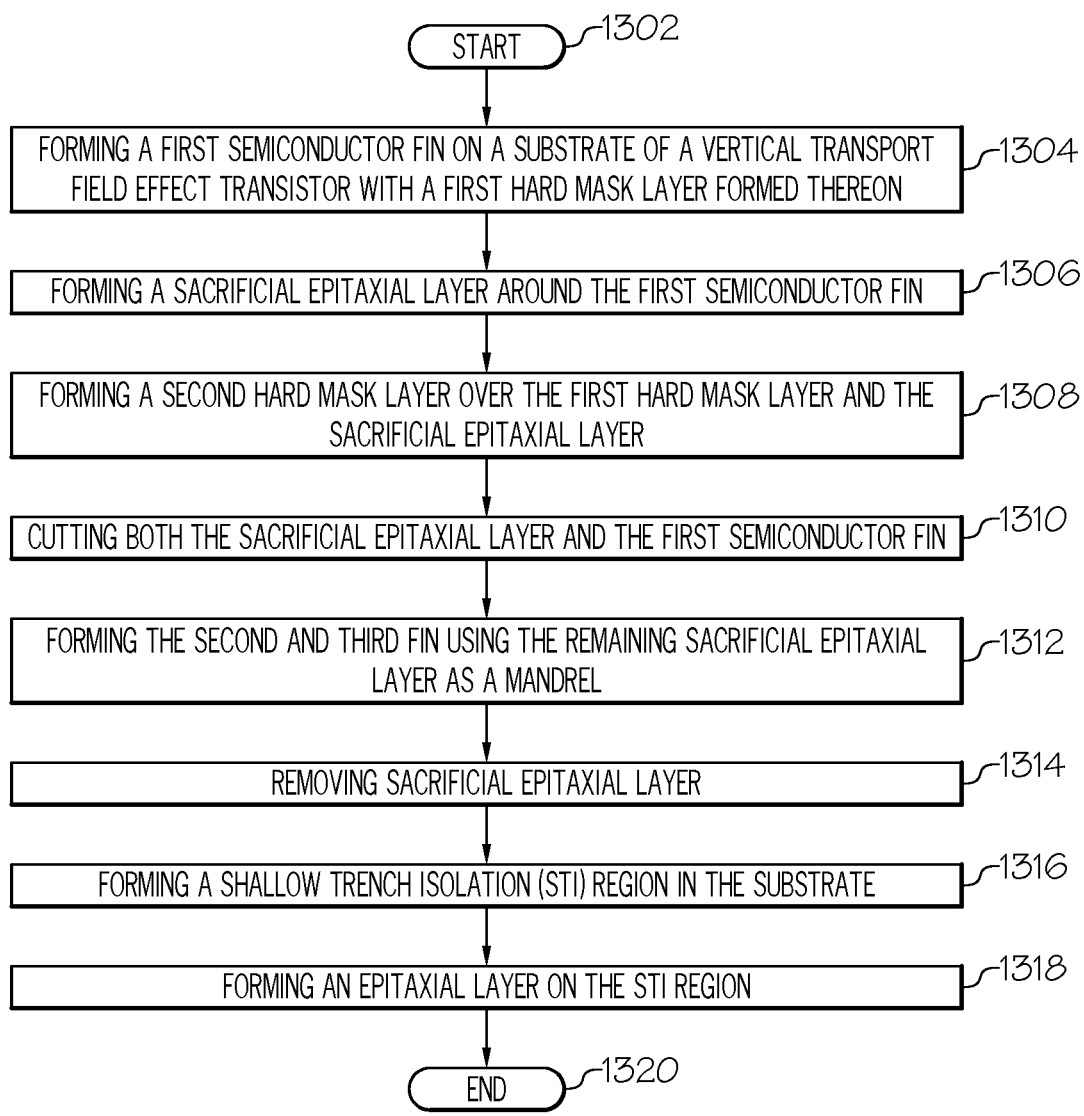
FIG. 13 is an operational flow diagram illustrating one example of a process for reducing the corner rounding of a vertical transport field effect transistors corresponding to the fabrication of the structure shown in FIGS. 2A-2B to 12A-12D above, according to a further embodiment of the present invention.

FIG. 13 is an operational flow diagram illustrating one example of a process for reducing the corner rounding of a vertical transport field effect transistors corresponding to the fabrication of the structure shown in FIGS. 2A-B to 12A-D above. It should be noted that each of the steps shown in FIG. 13 have been discussed in greater detail above with respect to FIGS. 2A-B to 12A-D.

The process begins in step 1302 and immediately proceeds to step 1304. In step 1304 in which a first semiconductor fin 206 on a substrate 102 of a vertical transport field effect transistor with a first hard mask layer 212 formed thereon. The process continues to step 1306. A sacrificial epitaxial layer 402 is formed around the first semiconductor fin 206 in step 1306. Next in step 1308 an additional dielectric hard mask layer 510 over the first hard mask layer 212 and the sacrificial epitaxial layer 402. The process continues to step 1308. In step 1310 both the sacrificial epitaxial layer 402 and the first semiconductor fin 206 are cut, leaving a remaining portion 650 of the sacrificial epitaxial layer. The process continues to step 1312. In step 1312 a second semiconductor fin and a third semiconductor fin are formed using the remaining portion 650 of the sacrificial epitaxial layer 402 as a mandrel 1010. The process continues to step 1314. In step 1314, the sacrificial epitaxy 402 is removed. The process continues to step 1316. In step 1316 a shallow trench isolation (STI) region is formed on a substrate of a vertical transport field effect transistor structure. The thickness of STI defines the distance between bottom epitaxial layer to the substrate. The process continues to step 1318. In step 1318 in which an epitaxial layer 1212 is formed on the STI region 1202. The process continues to step 1320 and ends.

In one example a lower source/drain area is formed on the STI region 1202. The sacrificial epitaxial layer is formed only at an intersection between the STI region 1202 and one or more of the first semiconductor fin, the second semiconductor fin.

In another example, the first semiconductor fin is formed in a first direction and the second semiconductor fin and the third semiconductor fin are formed in a second direction, the third semiconductor fin.

In still another example, the second semiconductor fin and a third semiconductor fin are parallel and the second direction is perpendicular to the first direction resulting in an essentially a H-shaped structure from a top-down view.

In still another example, the STI region between the second semiconductor fin and the third semiconductor fin is a trapezoidal-like-shape in which each of two non-parallel sides are defined by curves which curve away from each other at a lower region.

Non-Limiting Examples

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention. For example U.S. Pat. No. 10,418,484 with inventors Ruilong Xie et al. entitled "Vertical Field Effect Transistors Incorporating U-Shaped Semiconductor Bodies And Methods" is incorporated by reference in its entirety and includes fabrication details which may be used with the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising:
   a substrate;
   a shallow trench isolation (S.T.I.) region on the substrate; and
   a vertical field effect transistor comprising:
      a lower source/drain area on the S.T.I. region;
      a first semiconductor fin; and
      a second semiconductor fin, wherein the S.T.I. region that is beneath the lower source/drain area comprises opposing sidewall portions curved in opposing directions;
      a third semiconductor fin coupling the first semiconductor fin to the second semiconductor fin across the lower source/drain area,
   wherein the lower source/drain area is formed only at an intersection between the S.T.I. region and one or more of the first semiconductor fin, the second semiconductor fin, the third semiconductor fin.

2. The semiconductor structure of claim 1, wherein the second semiconductor fin is disposed parallel to the first semiconductor fin.

3. The semiconductor structure of claim 2, wherein the first semiconductor fin, the second semiconductor fin and the third semiconductor fin together form a H-shaped structure from a top-down view.

4. The semiconductor structure of claim 1, wherein the first semiconductor fin and the second semiconductor fin are formed above and immediately adjacent to the lower source/drain area and oriented in a first direction across the lower source/drain area and the third semiconductor fin is disposed in a second direction across the lower source/drain area.

5. The semiconductor structure of claim 1, wherein the third semiconductor fin is formed above and immediately adjacent to the lower source/drain area and wherein the third semiconductor fin extends laterally between and is in direct contact with adjacent ends of the first semiconductor fin and the second semiconductor fin.

6. The semiconductor structure of claim 2, wherein the S.T.I. region that is beneath the lower source/drain area between the first semiconductor fin and the second semiconductor fin is a trapezoidal-like-shape in which each of two non-parallel sides are defined by curves which curve away from each other at a lower region.

7. The semiconductor structure of claim 1, further comprising:
   at least one upper source/drain area on the first semiconductor fin and the second semiconductor fin.

8. The semiconductor structure of claim 1, further comprising:
   at least one upper source/drain area;
   wherein the lower source/drain area and the upper source/drain area have a same type conductivity, and
   wherein the vertical field effect transistor further comprises:
      a gate structure positioned laterally adjacent to sidewalls of the first semiconductor fin, the second semiconductor fin, and the third semiconductor fin of the semiconductor structure so as to define a single channel region within the first semiconductor fin, the second semiconductor fin, and the third semiconductor fin of the semiconductor structure;
      a lower spacer electrically isolating the gate structure from the lower source/drain area;
      an upper spacer electrically isolating the gate structure from the upper source/drain area; and
      a dielectric sidewall spacer positioned laterally immediately adjacent to the upper source/drain area and further above and immediately adjacent to the upper spacer, wherein the dielectric sidewall spacer, the upper spacer, and the gate structure have essentially aligned vertical surfaces.

9. A semiconductor structure comprising:
   a substrate;
   a shallow trench isolation (S.T.I.) region on the substrate; and
   a vertical field effect transistor comprising:
      a lower source/drain area on the S.T.I. region;
      a semiconductor body having three segments comprising:
         at least two parallel segments above and immediately adjacent to the lower source/drain area and oriented in a first direction across the lower source/drain area, wherein the S.T.I. region that is beneath the lower source/drain area between the parallel segments is a trapezoidal-like-shape in which each of two non-parallel sides are defined by curves which curve away from each other at a lower region; and
         a connecting segment above and immediately adjacent to the lower source/drain area and oriented in a second direction across the lower source/drain area, wherein the connecting segment extends laterally between and is in direct contact with adjacent ends of the parallel segments such that the semiconductor body is essentially H-shaped from a top-down view.

10. The semiconductor structure of claim 9, wherein the lower source/drain area is formed only at an intersection between the S.T.I. region and one or more of the at least two parallel segments and the connecting segment.

11. The semiconductor structure of claim 9, wherein the at least two parallel segments and the connecting segment have essentially equal heights.

12. The semiconductor structure of claim 9, further comprising:
   at least one upper source/drain area on the at least two parallel segments.

13. The semiconductor structure of claim 9, further comprising:
   at least one upper source/drain area;
   wherein the lower source/drain area and the upper source/drain area have a same type conductivity, and
   wherein the vertical field effect transistor further comprises:
      a gate structure positioned laterally adjacent to sidewalls of the three segments of the semiconductor body so as to define a single channel region within the three segments of the semiconductor body;
      a lower spacer electrically isolating the gate structure from the lower source/drain area;
      an upper spacer electrically isolating the gate structure from the upper source/drain area; and
      a dielectric sidewall spacer positioned laterally immediately adjacent to the upper source/drain area and further above and immediately adjacent to the upper spacer, wherein the dielectric sidewall spacer, the upper spacer, and the gate structure have essentially aligned vertical surfaces.

* * * * *